(12) United States Patent
Namkung et al.

(10) Patent No.: US 10,804,490 B2
(45) Date of Patent: Oct. 13, 2020

(54) DISPLAY DEVICE

(71) Applicant: SAMSUNG DISPLAY CO., LTD., Yongin-si, Gyeonggi-do (KR)

(72) Inventors: Jun Namkung, Asan-si (KR); Soon Ryong Park, Sejong-si (KR); Chul Woo Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/997,595

(22) Filed: Jun. 4, 2018

(65) Prior Publication Data
US 2018/0287095 A1 Oct. 4, 2018

Related U.S. Application Data

(63) Continuation of application No. 14/956,263, filed on Dec. 1, 2015, now Pat. No. 9,991,467.

(30) Foreign Application Priority Data

May 4, 2015 (KR) .................. 10-2015-0062743

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3276* (2013.01); *H01L 27/3297* (2013.01); *H01L 51/0097* (2013.01); *H01L 51/5203* (2013.01); *H01L 2251/5338* (2013.01); *Y02E 10/549* (2013.01)

(58) Field of Classification Search
CPC ............ H01L 51/5253; H01L 51/0097; H01L 51/5203; H01L 27/3276; H01L 27/3297
See application file for complete search history.

(56) References Cited

U.S. PATENT DOCUMENTS

| | | | |
|---|---|---|---|
| 6,104,464 A | 8/2000 | Adachi et al. | |
| 9,991,467 B2 * | 6/2018 | Namkung | H01L 51/5253 |
| 2003/0214715 A1 | 11/2003 | Bermel | |
| 2010/0302620 A1 | 12/2010 | Makubo et al. | |
| 2013/0148312 A1 | 6/2013 | Han et al. | |
| 2014/0307396 A1 | 10/2014 | Lee | |
| 2015/0021570 A1 | 1/2015 | Kim et al. | |
| 2016/0181181 A1 | 6/2016 | Su | |
| 2016/0234937 A1 | 8/2016 | Su et al. | |

FOREIGN PATENT DOCUMENTS

| | | |
|---|---|---|
| KR | 10-2010-0096496 A | 9/2010 |
| KR | 10-2013-0118100 A | 10/2013 |
| KR | 10-2014-0108914 A | 9/2014 |
| KR | 10-2015-0031096 A | 3/2015 |

* cited by examiner

*Primary Examiner* — Matthew L Reames
(74) *Attorney, Agent, or Firm* — Lewis Roca Rothgerber Christie LLP

(57) ABSTRACT

A display device includes a flexible substrate having a display area for displaying an image, and a pad area adjacent the display area, a circuit film coupled to the flexible substrate at the pad area, and a passivation layer on at least a part of the circuit film and at part of the pad area.

15 Claims, 17 Drawing Sheets

DISPLAY DEVICE

CROSS-REFERENCE TO RELATED APPLICATION

This application is a continuation of U.S. patent application Ser. No. 14/956,263, filed Dec. 1, 2015, which claims priority to and the benefit of Korean Patent Application No. 10-2015-0062743, filed May 4, 2015, the entire content of both of which is incorporated herein by reference.

BACKGROUND

1. Field

The present disclosure relates to a display device.

2. Description of the Related Art

Recently, a flexible display device that includes a flexible substrate, that is light, that is resilient to impact, and that is easily bent or curved, has been developed. As such, the flexible display device can be folded or rolled to increase or maximize portability, and can be used in various fields.

Generally, the flexible display device includes a display panel, a printed circuit board (PCB) with a control circuit that is configured to transmit a control signal to the display panel, and a circuit film connecting the display panel and the PCB to each other.

However, because the circuit film has a smaller width than the display panel to be attached to an end of the display panel, when the display panel is repeatedly curved or pulled, stress may be locally concentrated at the region where the display panel and the circuit film are attached, and as a result, there may be a problem in that the attachment between the display panel and the circuit film may break or release. Further, because the panel receives bending stress while the display panel is curved or folded, a crack and the like may be generated on the substrate, and as a result, there may be damage to a thin film transistor or a light emitting element.

The above information disclosed in this Background section is only for enhancement of understanding of the background of the disclosure, and therefore it may contain information that does not form the prior art that is already known in this country to a person of ordinary skill in the art.

SUMMARY

Embodiments of the present invention provide a display device having aspects of reducing or preventing damage to a display panel from caused by a circuit film being released, or by a crack and the like being generated on a substrate.

Aspects to be achieved in the present disclosure are not limited to the aforementioned aspects, and other non-mentioned aspects will be understood by those skilled in the art from the description below.

An exemplary embodiment provides a display device including a flexible substrate having a display area for displaying an image, and a pad area adjacent the display area, a circuit film coupled to the flexible substrate at the pad area, and a passivation layer on at least a part of the circuit film and at part of the pad area.

The display device may further include a printed circuit board attached to the circuit film to be electrically connected with the display area.

The display device may further include a lower protective film attached to a lower portion of the flexible substrate.

The passivation layer may be at the pad area, and the passivation layer and a printed circuit board may entirely cover the circuit film.

The passivation layer may include a protective film or a protective coating layer.

An elastic coefficient of the protective film may be about 0.1 GPa to about 200 GPa.

A thickness of the protective film may be about 10 μm to about 200 μm.

The protective film may include at least one of polyethylene terephthalate, polyethylene naphthalate, polycarbonate, polyarylate, polyetherimide, polyethersulfone, or polyimide.

The display device may further include a lower protective film attached to a lower portion of the flexible substrate, wherein at least one of an upper surface of the protective film or a lower surface of the lower protective film includes a pattern portion at the pad area.

The pattern portion may define a plurality of grooves.

Each of the plurality of grooves may be cross-sectionally shaped as a triangle, a quadrangle, a polygon, a hemisphere, or a circle.

Each of the plurality of grooves may have a trapezoid cross-sectional shape.

The protective coating layer may include at least one of an acryl-based polymer, a urethane-based polymer, or an epoxy-based polymer.

A viscosity of the protective coating layer may be about 100 cp to about 3,000 cp.

A thickness of the lower protective film is about 10 μm to about 200 μm.

The pad area may be curved toward a lower surface of the flexible substrate, and the circuit film may overlap the flexible substrate at a point below the lower surface of the flexible substrate.

DETAILED DESCRIPTION

Figure 1:
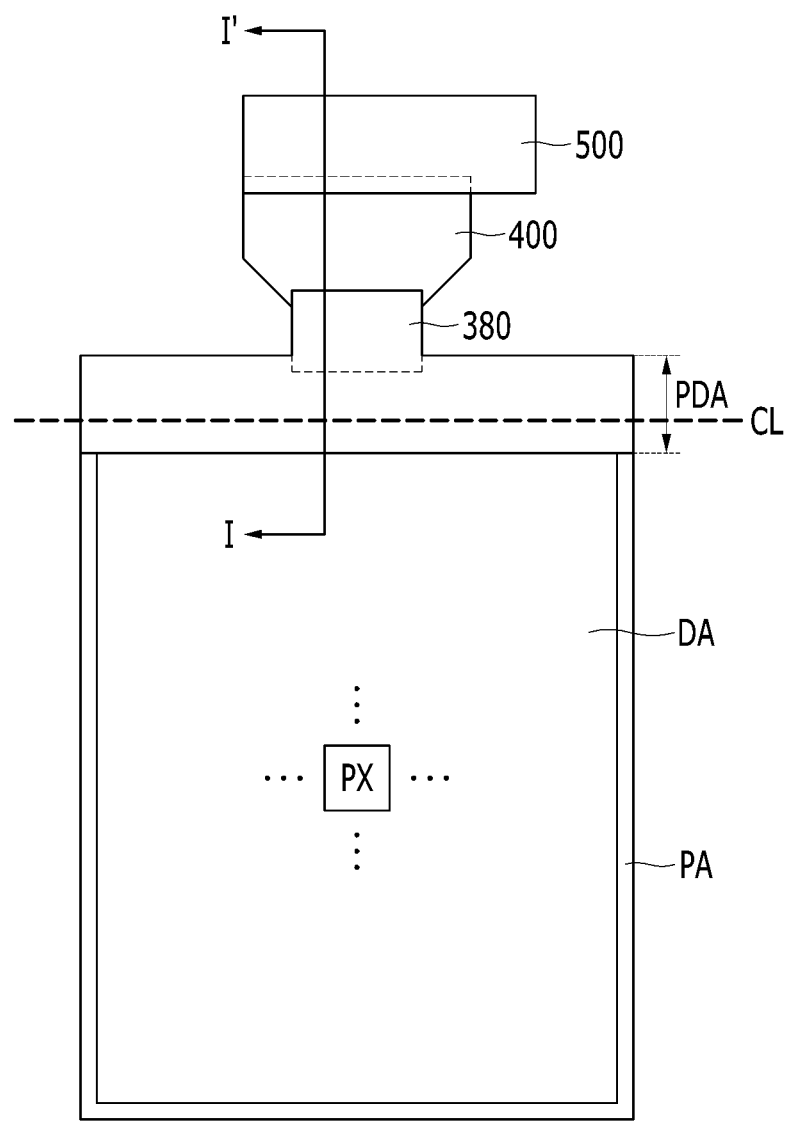
FIG. 1 is a plan view of a display device according to an exemplary embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, the present disclosure will be described in detail with reference to the accompanying drawings.

Figure 2:
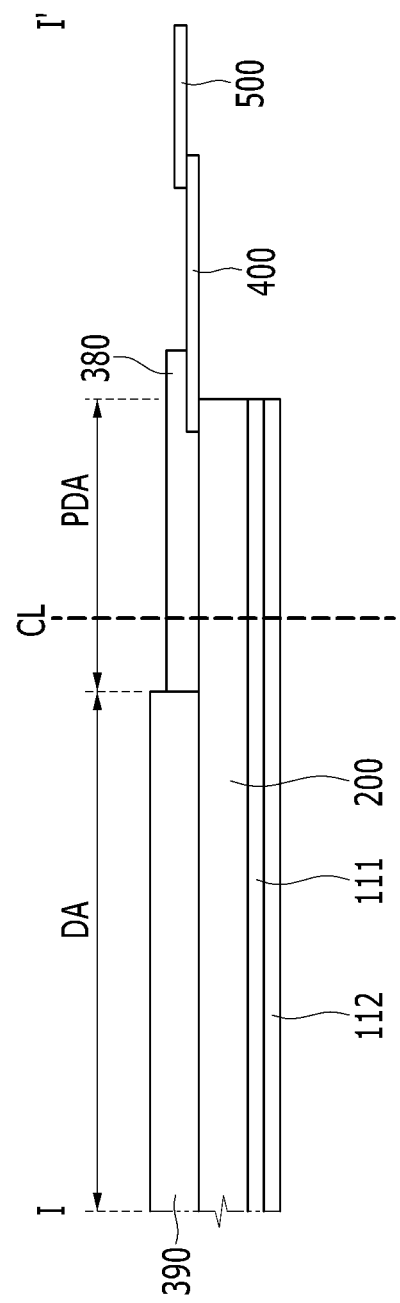
FIG. 2 is a cross-sectional view of the display device of FIG. 1 taken along the line I-I'.

FIG. 1 is a plan view of a display device according to an exemplary embodiment, and FIG. 2 is a cross-sectional view of the display device of FIG. 1 taken along the line I-I'.

Referring to FIGS. 1 and 2, a display device according to an exemplary embodiment includes a flexible substrate 112 including a display area DA for displaying an image, and a pad area PDA at a side of the display area, a circuit film 400 attached to the pad area PDA, and a passivation layer 380 on at least a part of the pad area PDA and a part of the circuit film 400.

The display device of the present embodiment may further include a printed circuit board 500 that is connected with the circuit film 400 to be electrically connected with the display area DA.

The flexible substrate 112 may include plastic and the like, which is flexible and may be easily curved. For example, the flexible substrate 112 may include polyethylene terephthalate, polyethylene naphthalate, polycarbonate, polyarylate, polyetherimide, polyethersulfone, polyimide, or the like, although the flexible substrate 112 is not limited thereto.

A barrier layer 111 may be formed on the flexible substrate 112, may reduce or prevent external impurities from penetrating into an upper display element layer by passing through the flexible substrate 112, and may have a flatly formed surface. In detail, the barrier layer 111 may include at least one of an inorganic layer and an organic layer, and for example, may include silicon nitride (SiNx), silicon oxide ($SiO_2$), silicon oxynitride (SiOxNy), or the like, although the barrier layer 111 is not limited thereto. Further, embodiments of the present invention may omit the barrier layer 111.

A display element layer 200 including a plurality of thin films is formed on the barrier layer 111. The display element layer 200 includes a plurality of signal lines, and a plurality of pixels PX connected to the signal lines, arranged substantially in a matrix form, and positioned in the display area DA. In this case, the signal lines may include a plurality of scanning signal lines for transferring scanning signals, and a plurality of data lines for transferring data signals. Further, the display element layer 200 may include a pad area PDA to which the circuit film 400, which is for connecting the display area DA and the flexible printed circuit board 500 including a control circuit for transmitting a control signal to the display area DA, is attached.

The circuit film 400 is configured by an insulation film, such as polyimide and the like, on which a wire pattern is formed. Further, the circuit film 400 may be configured by a flexible printed circuit film, or may be configured by a chip on film including an IC chip or a tape carrier package.

Further, one end of the circuit film 400 is fixed to the pad area PDA to be electrically connected with pad electrodes, and another end of the circuit film 400 is fixed to the flexible printed circuit board 500 to be electrically connected with wires of the flexible printed circuit board 500. The control signal of the flexible printed circuit board 500 is transferred to the display panel through the circuit film 400 to implement the image in the display area DA.

The passivation layer 380 is formed on at least a part of the pad area PDA and a part of the circuit film 400. At least a part of the pad area PDA with the passivation layer 380 includes a portion where a bending line CL is positioned, the bending line CL being a reference for where the substrate 112 is folded or curved, as illustrated in FIGS. 1 and 2.

In more detail, in the present disclosure, the passivation layer 380 serves to reduce stress applied to the display device when the substrate 112 is folded or curved at the bending line CL, thereby reducing the likelihood of the circuit film 400 being released from the pad area PDA, and thereby reducing or preventing cracking on the display element layer 200.

The passivation layer 380 may be formed as a protective film that is attached to at least a part of the pad area PDA and a part of the circuit film 400, or may be formed such that a protective coating layer is formed in the area using a coating composition.

First, a case where the passivation layer 380 is formed by attaching the protective film using an adhesive will be described. In this case, the adhesive may use both aqueous and non-aqueous adhesives, which may be known in the art, although the adhesive is not particularly limited.

An elastic coefficient of the protective film may be about 0.1 GPa to about 200 GPa, allowing a thinner protective film to be attached without inhibiting a function of the protective film.

The thickness of the protective film may be about 10 μm to about 200 μm. When the thickness of the protective film is smaller than about 10 μm, reduction of stress applied to the curved portion may be ineffective or minimal when the pad area PDA of the display device is folded back or curved. When the thickness of the protective film is larger than about 200 μm, flexibility of the display device may deteriorate due to the thickness of the protective film.

The protective film may include at least one of polyethylene terephthalate, polyethylene naphthalate, polycarbonate, polyarylate, polyetherimide, polyethersulfone, or polyimide, although the protective film is not limited thereto.

Figure 3:
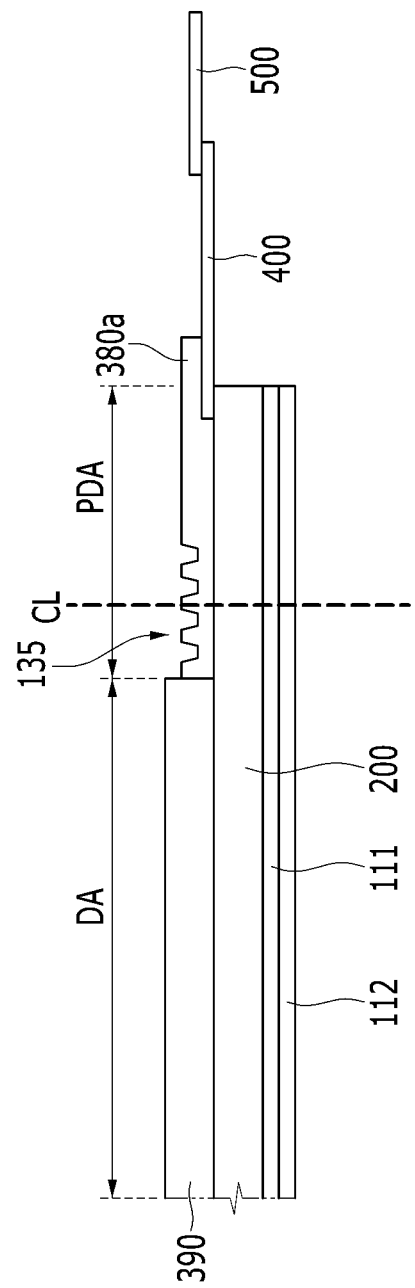
FIG. 3 is a cross-sectional view of the display device according to an exemplary embodiment.
Figure 4:
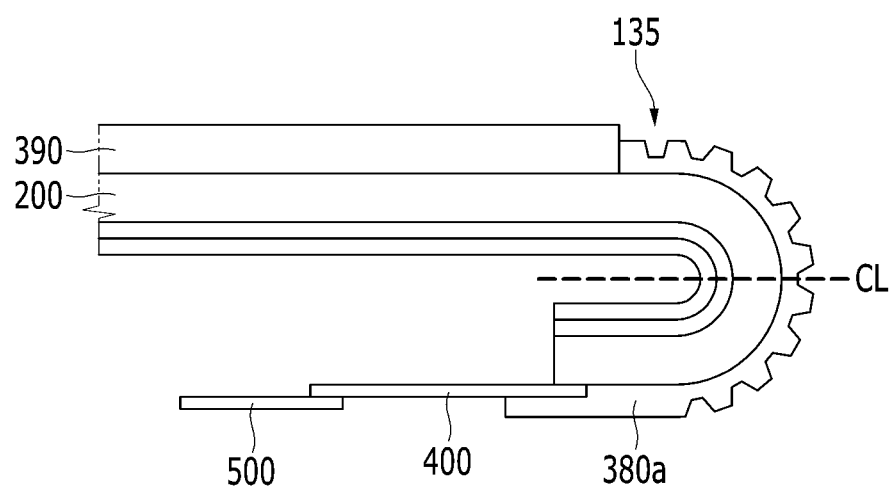
FIG. 4 is a cross-sectional view illustrating an appearance where a pad area is folded back in the display device of FIG. 3.

FIG. 3 is a cross-sectional view of the display device according to an exemplary embodiment, and FIG. 4 is a cross-sectional view illustrating an appearance where a pad area is folded back in the display device of FIG. 3.

In the display device according to the present exemplary embodiment, as illustrated in FIG. 4, the pad area PDA of the display device is curved back toward an opposite side/back of the display area DA (e.g., toward a lower surface of the flexible substrate 112), and the circuit film 400 and the flexible printed circuit board 500 may overlap the flexible substrate 112 at the opposite side of the display area DA (e.g., behind the display area DA, or below the lower surface of the flexible substrate).

In the present embodiment, a protective film 380a may include a predetermined pattern portion 135 adjacent an upper surface of the display area DA, that is, the other surface of the surface attached with the display panel. In the present embodiment, the pattern portion 135 includes a plurality of grooves to form an uneven surface. Further, the plurality of grooves may be regularly or irregularly arranged, and shapes of the grooves may also be regular or irregular. However, from the viewpoint of ease of fabrication of the protective film 380a including the pattern portion 135, the plurality of grooves may be regular.

Figure 5:
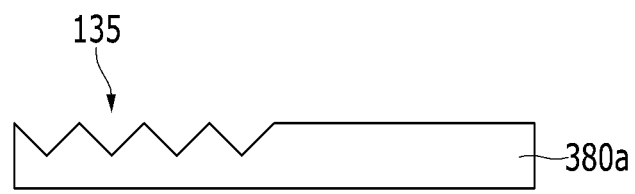
FIGS. 5 to 7 exemplarily illustrate cross-sectional views of a case where a protective film of the display device according to exemplary embodiments includes a pattern portion.
Figure 6:
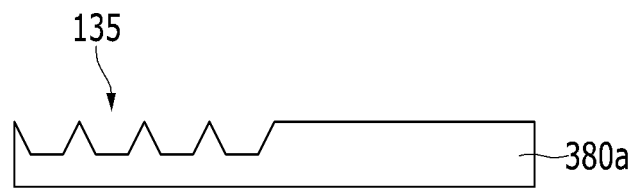
Figure 7:
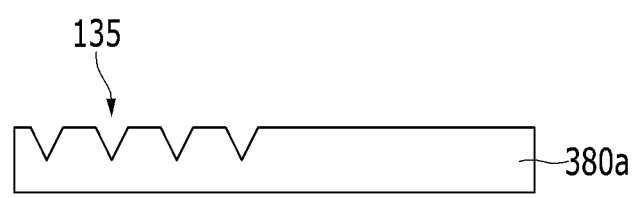

In FIGS. 5 to 7, the protective film 380a including the pattern portion 135 is exemplarily illustrated. In the present disclosure, the shape of each groove may be triangular, as illustrated in FIGS. 5 and 7, or may be shaped as a quadrangle, such as a trapezoid as illustrated in FIG. 6. Further, the shape of the grooves may be a shape such as a polygon, a hemisphere, and/or a circle. Further, there may be little to no distance between adjacent ones of the grooves in the pattern portion 135, as illustrated in FIGS. 5 and 6, or distance between adjacent ones of the grooves may be larger, as illustrated in FIG. 7. As an example, the pattern portion 135 may be formed to have a predetermined distance between a trapezoid groove and an adjacent groove.

As such, when the pattern portion 135 is included at the upper surface of the protective film 380a, as illustrated in FIG. 4, because the stress applied to the curved/folded portion of the display device (e.g., locally applied normal force) may be distributed through the pattern portion 135, risk of detachment of the circuit film 400 below the protective film, and/or risk of damage of the display element layer 200 and the like, may be reduced or minimized, thereby preventing the display device from being damaged (e.g., by preventing cracking).

Next, an embodiment in which the passivation layer 380 is formed in a protective coating layer form will be described. The protective coating layer may be formed by using a coating composition including at least one of an acryl-based polymer, a urethane-based polymer, and an epoxy-based polymer.

In the present embodiment, viscosity of the coating composition may be about 100 cp to about 3,000 cp. When the viscosity is smaller than about 100 cp, thickness of the coating layer may be excessively increased, and when the viscosity is larger than about 3,000 cp, it may be difficult to form a uniform protective coating layer.

The formation of the protective coating layer is not particularly limited so long as the protective coating layer ensures constant or near constant uniformity. As an example, the formation of the protective coating layer may use at least one method of Inkjet coating, slit coating, jet coating, and/or dispenser coating.

Figure 8:
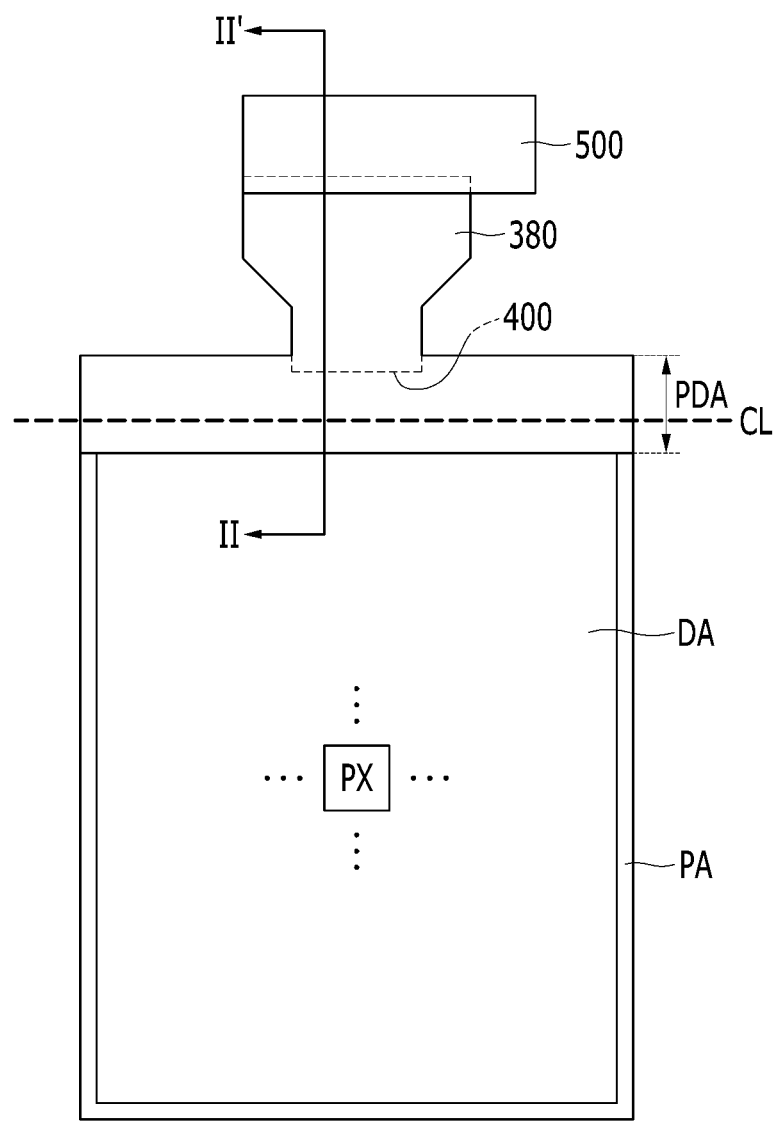
FIG. 8 is a plan view of the display device according to an exemplary embodiment.
Figure 9:
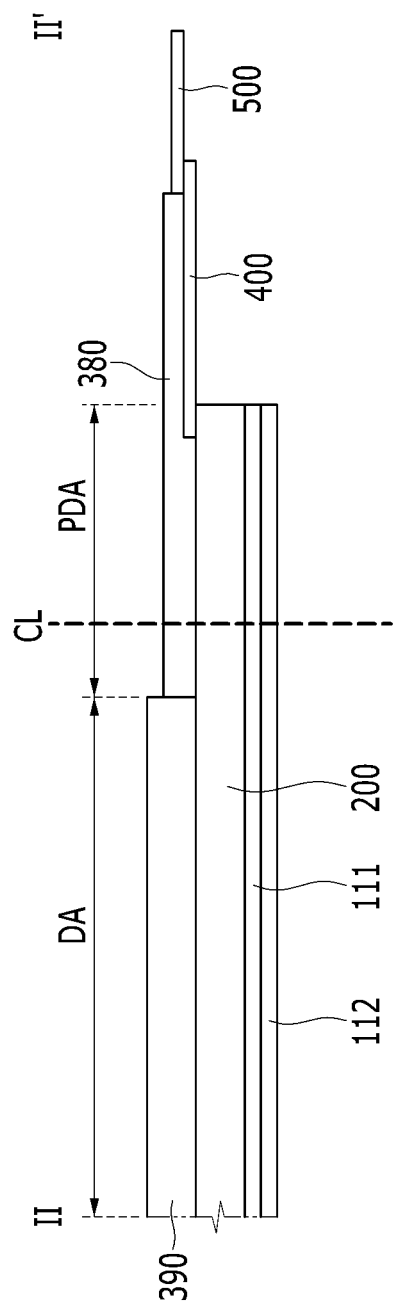
FIG. 9 is a cross-sectional view of the display device of FIG. 8 taken along the line II-II'.

FIG. 8 is a plan view of the display device according to an exemplary embodiment, and FIG. 9 is a cross-sectional view of the display device of FIG. 8 taken along the line II-II'.

Referring to FIGS. 8 and 9, the passivation layer 380 may be formed on the pad area PDA and on an entirety of an otherwise exposed surface of the circuit film 400. When the passivation layer 380 covers the entire surface of the circuit film 400 that is not covered by the flexible printed circuit board 500, stress reduction for reducing or preventing cracking on the display element layer 200, and for reducing or preventing detachment of the circuit film 400, may be improved.

Here, aspects of the display device according to an exemplary embodiment illustrated in FIGS. 8 and 9 (e.g., configurations of the flexible substrate 112, the barrier layer 111, the circuit film 400, the passivation layer 380, and the printed circuit board 500) may be the same as described above, and descriptions thereof will, therefore, not be repeated.

Figure 10:
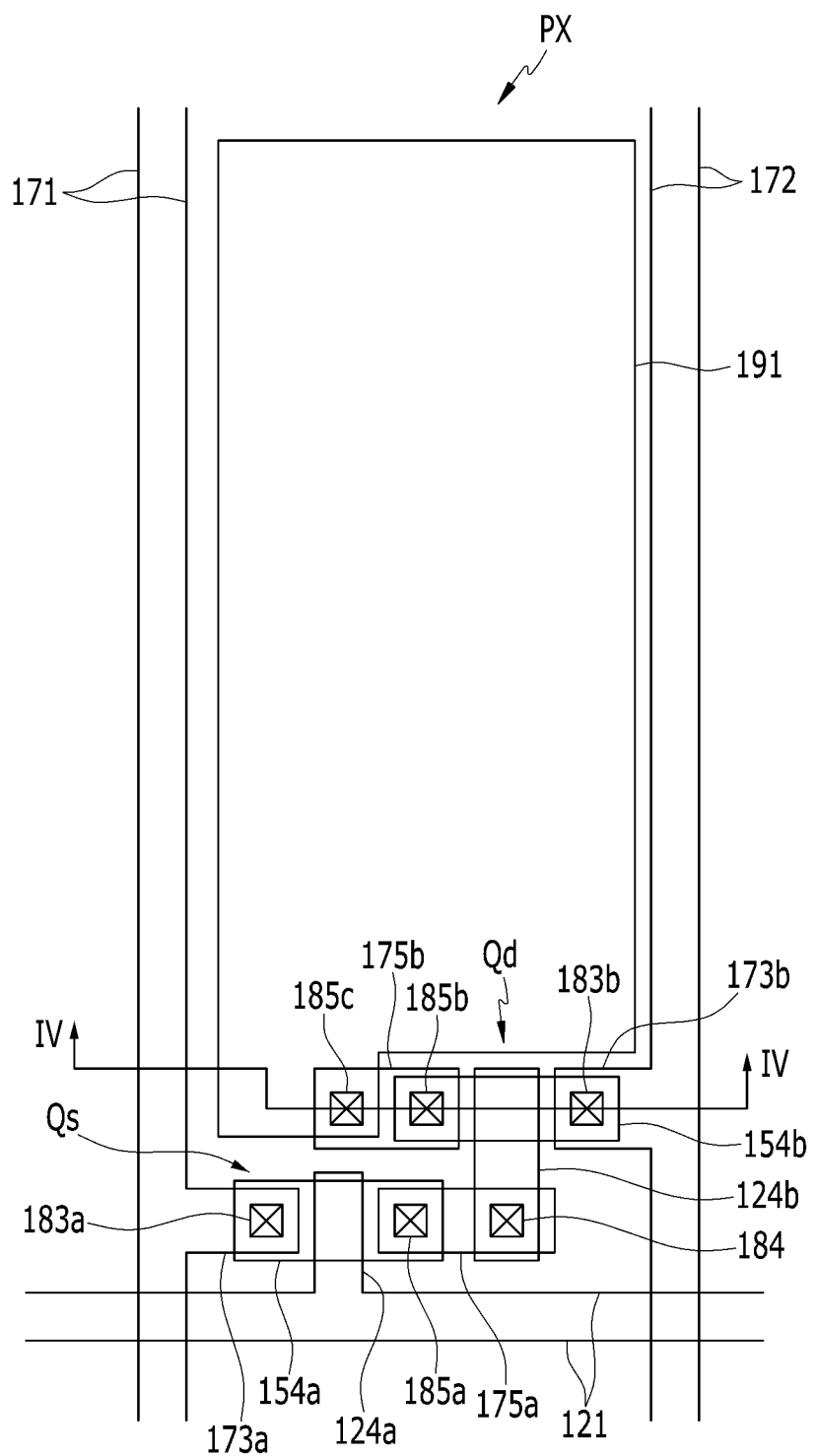
FIG. 10 is a layout view of one pixel of the display device according to an exemplary embodiment.
Figure 11:
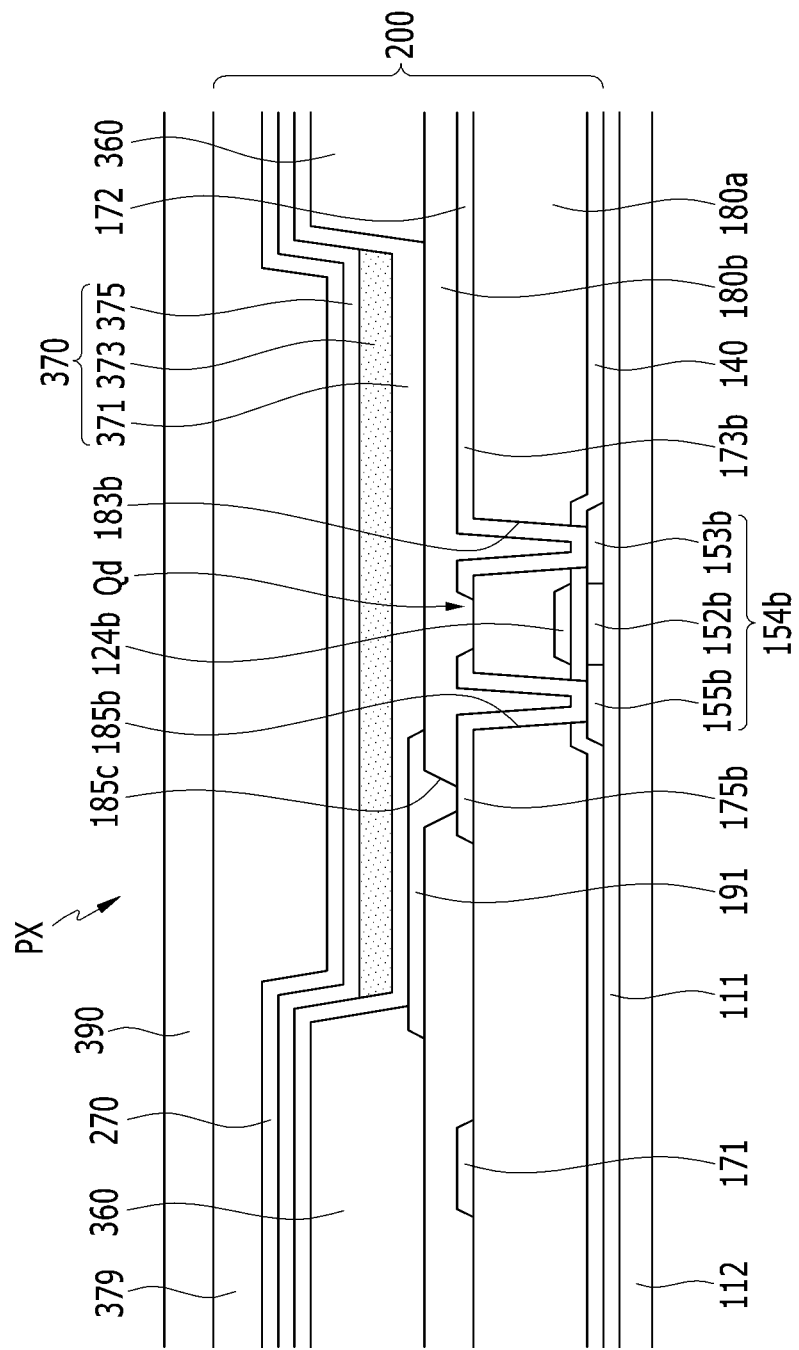
FIG. 11 is a cross-sectional view of the display device of FIG. 10 taken along the line IV-IV.

FIG. 10 is a layout view of one pixel of the display device according to an exemplary embodiment, and FIG. 11 is a cross-sectional view of the display device of FIG. 10 taken along the line IV-IV.

Referring to FIGS. 10 and 11, one example of the structure of the display element layer 200 will be described.

First, a plurality of first semiconductors 154a and a plurality of second semiconductors 154b are formed on the barrier layer 111. A first semiconductor 154a may include a channel region, a source region, and drain region, the source and drain regions being respectively positioned at sides of the channel region and formed to be doped. A second semiconductor 154b may include a channel region 152b, and a source region 153b and a drain region 155b positioned at respective sides of the channel region 152b and formed to be doped. The first semiconductor 154a and the second semiconductor 154b may include amorphous silicon, polysilicon, or oxide semiconductor.

Next, a gate insulating layer 140 made of silicon nitride (SiNx), silicon oxide (SiO$_2$), or the like is positioned on the first semiconductor 154a and the second semiconductor 154b.

Further, a plurality of scanning signal lines 121 each including a first control electrode 124a, and a plurality of gate conductors each including a second control electrode 124b, are formed on the gate insulating layer 140.

The scanning signal lines 121 may transfer scanning signals and may extend mainly in a horizontal direction. The first control electrode 124a may extend upward, or vertically, from the scanning signal line 121. The second control electrode 124b is separated from the scanning signal line 121, and may include a storage electrode (e.g., an electrode of a capacitor) elongated in a vertical direction. The first control electrode 124a may overlap a part of the first semiconductor 154a (e.g., the channel region of the first semiconductor 154a), and the second control electrode 124b may overlap a part of the second semiconductor 154b (e.g., the channel region 152b).

Further, a first passivation layer 180a is positioned on the gate insulating layer 140 and the gate conductor. The first passivation layer 180a and the gate insulating layer 140 collectively include a contact hole 183a exposing the source region of the first semiconductor 154a, a contact hole 185a exposing the drain region of the first semiconductor 154a, a contact hole 183b exposing the source region 153b of the second semiconductor 154b, and a contact hole 185b exposing the drain region 155b. The first passivation layer 180a includes a contact hole 184 exposing a second control electrode 124b.

Next, a plurality of data conductors including a plurality of data lines 171, a plurality of driving voltage lines 172, a plurality of first output electrodes 175a, and a plurality of second output electrodes 175b is formed on the first passivation layer 180a. In the present embodiment, the data line 171 is configured to transfer a data signal, and mainly extends in a vertical direction to cross the scanning signal line 121. Each data line 171 includes a plurality of first input electrodes 173a extending toward the first control electrode 124a.

The driving voltage line 172 is configured to transfer a driving voltage, and mainly extends in a vertical direction to cross the scanning signal line 121. Each driving voltage line 172 includes a plurality of second input electrode 173b that extends toward the second control electrode 124b. When the second control electrode 124b includes the storage electrode, the driving voltage line 172 may include a portion overlapping with the storage electrode.

The first and second output electrodes 175a and 175b are separated from each other (e.g., to have island shapes), and are separated from the data line 171 and the driving voltage line 172. The first input electrode 173a and the first output electrode 175a face each other on the first semiconductor 154a, and the second input electrode 173b and the second output electrode 175b face each other on the second semiconductor 154b.

In the present embodiment, the first input electrode 173a and the first output electrode 175a may be respectively connected to the source region and the drain region of the first semiconductor 154a through respective ones of the contact holes 183a and 185a. The first output electrode 175a may be connected to the second control electrode 124b through the contact hole 184. The second input electrode 173b and the second output electrode 175b may be respectively connected to the source region 153b and the drain region 155b of the second semiconductor 154b through respective ones of the contact holes 183b and 185b.

The first control electrode 124a, the first input electrode 173a, and the first output electrode 175a form a switching thin film transistor Qs together with the first semiconductor 154a. The second control electrode 124b, the second input electrode 173b, and the second output electrode 175b form a driving thin film transistor Qd together with the second semiconductor 154b. The structures of the switching thin film transistor Qs and the driving thin film transistor Qd are not limited to the above, but may be variously modified.

A second passivation layer 180b made of an inorganic insulating material such as silicon nitride or silicon oxide may be positioned on the plurality of data conductors. The second passivation layer 180b may have a flat surface/may remove a step to increase light emission efficiency of an organic light emitting element formed thereon. The second passivation layer 180b may have a contact hole 185c exposing the second output electrode 175b.

Additionally, a plurality of pixel electrodes 191 is positioned on the second passivation layer 180b, and the pixel electrode 191 of each pixel PX may be physically and electrically connected with the second output electrode 175b through the contact hole 185c of the second passivation layer 180b. The pixel electrode 191 may include a semi-transmissive conductive material or a reflective conductive material.

Further, a pixel defining layer 360 (also referred to a partition wall) having a plurality of openings exposing respective ones of the pixel electrodes 191 may be positioned on the second passivation layer 180b. Each of the openings of the pixel defining layer 360 exposing the pixel electrodes 191 may define a pixel area. In other embodiments, the pixel defining layer 360 may be omitted.

A light emitting member 370 is positioned on the pixel defining layer 360 and on the pixel electrode 191, and may include a first organic common layer 371, a plurality of light emitting layers 373, and a second organic common layer 375 that are sequentially laminated.

In the present embodiment, the first organic common layer 371 may include, for example, at least one of a hole injecting layer and a hole transport layer, which are sequentially laminated. The first organic common layer 371 may be formed on an entirety of the display area in which the pixels PX are located, or may be formed only in each pixel PX area.

Further, the light emitting layer 373 may be positioned on the pixel electrode 191 of each corresponding pixel PX. The light emitting layer 373 may be made of an organic material that uniquely emits light of the primary colors, such as red, green, and blue, and may have a structure in which a plurality of organic material layers for emitting light of different colors are laminated.

Further, the second organic common layer 375 may include, for example, at least one of an electron transport layer and an electron injecting layer that are sequentially laminated. The second organic common layer 375 may be formed over an entirety of the display area in which the pixels PX are located, or may be formed only in each pixel PX area.

The first and second organic common layers 371 and 375 are layers for improving light emitting efficiency of the light emitting layer 373, and any one of the first and second organic common layers 371 and 375 may be omitted in other embodiments.

Next, a common electrode 270 transferring a common voltage Vss is formed on the light emitting member 370, and may include a transparent conductive material. For example, the common electrode 270 may be made of a transparent conductive material, or may be formed by thinly laminating metals of calcium (Ca), barium (Ba), magnesium (Mg), aluminum (Al), silver (Ag), and the like to have a light transmitting property.

Meanwhile, the pixel electrode 191, the light emitting member 370, and the common electrode 270 of each pixel PX form a light emitting element LD, and one of the pixel electrode 191 and the common electrode 270 functions as a cathode, while the other electrode functions as an anode. Further, the storage electrode and the driving voltage line 172, which overlap each other, may form a storage capacitor Cst.

The display element layer 200 according to the present exemplary embodiment may be a top emission type, in which internal light is emitted from the light emitting member 370 to the surface of the flexible substrate 112 to display an image.

An encapsulation layer 379 may be formed on the common electrode 270, and may encapsulate the light emitting member 370 and the common electrode 270 to prevent moisture and/or oxygen from penetrating from the outside. The upper surface of the encapsulation layer 379 may be flat. The encapsulation layer 379 may include a plurality of thin film layers, such as a multilayer structure including one or more of inorganic layers and organic layers. As a result, the display element layer 200 including the thin film transistor (e.g., Qs and/or Qd), the light emitting element LD, and the encapsulation layer 379 may be completed.

Next, a polarization film 390 may be formed on the display element layer 200. The polarization film 390 is configured to convert an optical axis of light emitted to the outside through the display element layer 200. Generally, the polarization film 390 has a structure in which transparent protective films are laminated on one or both sides of a polarizer made of a polyvinyl alcohol-based resin.

In more detail, the polarization film 390 may be formed as a structure including a triacetyl cellulose (TAC) film as a protective film is adhered to a polarizer having a structure in which polyvinyl alcohol (hereinafter, referred to as PVA)-based molecular chains are aligned in a predetermined direction, and an iodine-based compound or a dichroic polarizing material. Further, the polarizer and the protective film are generally adhered to each other by a water-based adhesive made of a polyvinyl alcohol-based solution. However, in the present disclosure, the polarization film 390 is not limited to the above, and polarization films formed of various structures and materials may be used.

Figure 12:
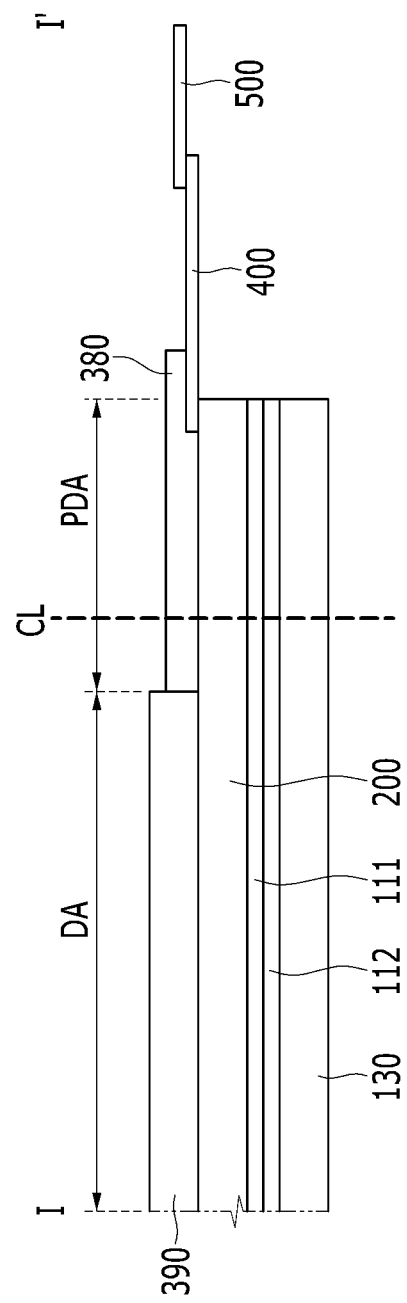
FIGS. 12, 14, 16, and 18 are cross-sectional views of the display device according to an exemplary embodiment, respectively.
Figure 13:
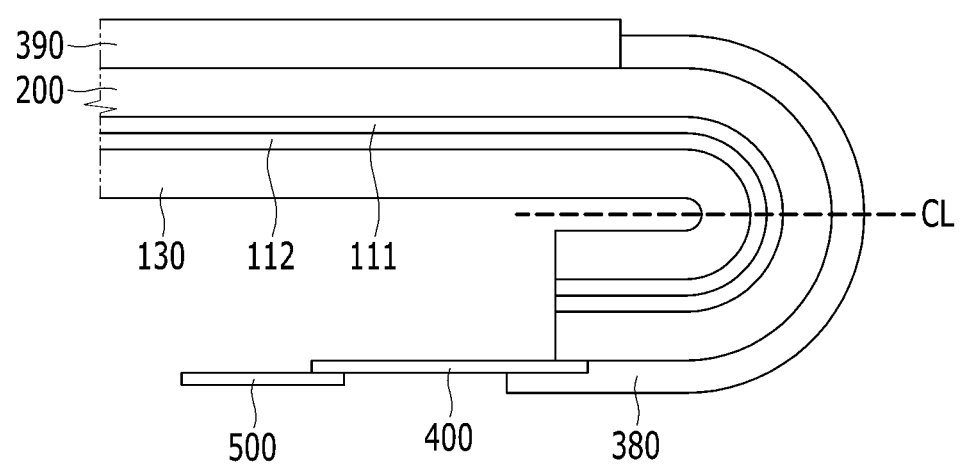
FIGS. 13, 15, 17, and 19 are cross-sectional views illustrating an appearance in which a pad area is folded back in the display device of FIGS. 12, 14, and 16, respectively.

FIG. 12 is a cross-sectional view of the display device according to an exemplary embodiment, and FIG. 13 is a cross-sectional view illustrating an appearance where a pad area is folded back in the display device of FIG. 12. That is, in the display device according to the exemplary embodiment illustrated in FIG. 13, the pad area of the display device is curved toward the opposite side/back of the display area DA, and the circuit film and the printed circuit board may overlap the flexible substrate 112 at the opposite side of the display area DA (e.g., below a lower surface of the flexible substrate 112).

Referring to FIGS. 12 and 13, the display device according to the present exemplary embodiment may further include a lower protective film 130 attached to the lower portion of the flexible substrate 112 in the aforementioned display device, wherein the lower protective film 130 may be positioned in both the display area DA and pad area PDA. Further, the lower protective film 130 may include one or more of polyethylene terephthalate, polyethylene naphthalate (PEN), polyethylene sulfide (PES), and/or polyethylene (PE), although the lower protective film 130 is not particularly limited. That is, the lower protective film 130 may be made of a polymer material having good elasticity.

Further, thickness of the lower protective film 130 may be about 10 μm to about 200 μm. When the thickness of the lower protective film 130 is smaller than about 10 μm, it may be difficult to effectively protect the lower portion of the display device due to a very small thickness. When the thickness of the lower protective film 130 is larger than about 200 μm, it may be difficult to have a sufficiently flexible display device when the lower protective film 130 is attached to the lower portion of the flexible substrate 112.

Because other configurations of the display device according to the present exemplary embodiment illustrated in FIGS. 12 and 13 (e.g., configurations of the flexible substrate 112, the barrier layer 111, the display element layer 200, the circuit film 400, the passivation layer 380, and the printed circuit board 500) may be the same as described above, repeated description of the configurations will be omitted.

Figure 14:
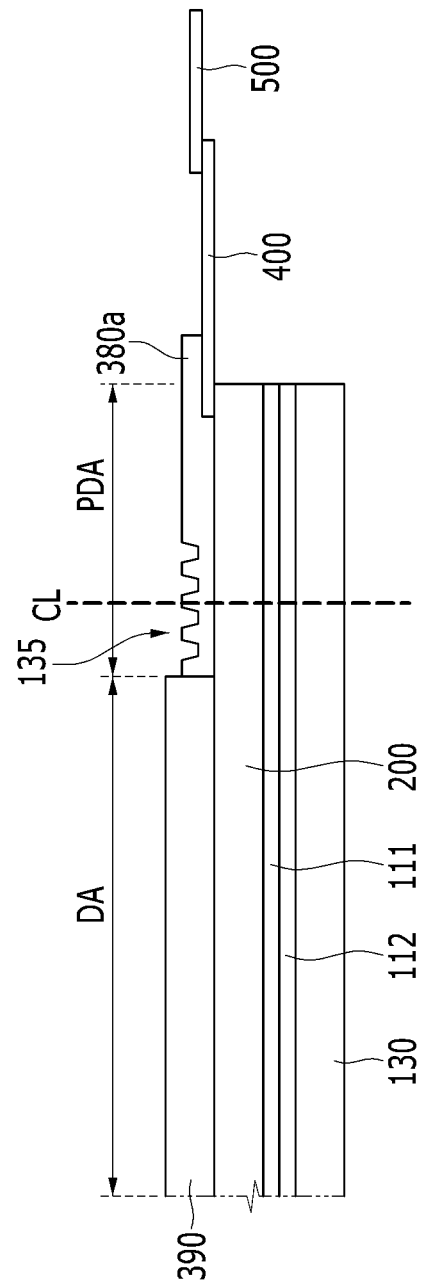
Figure 15:
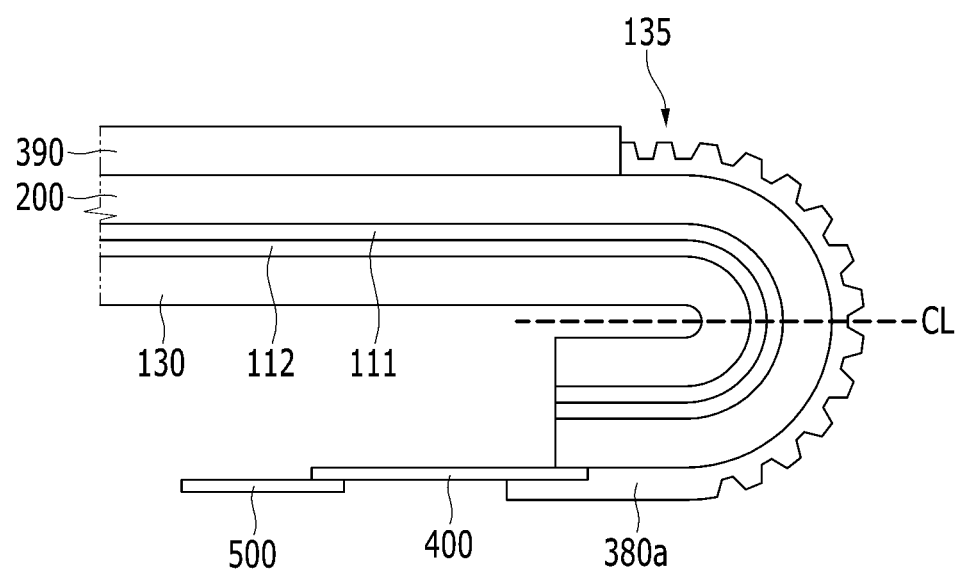
Figure 16:
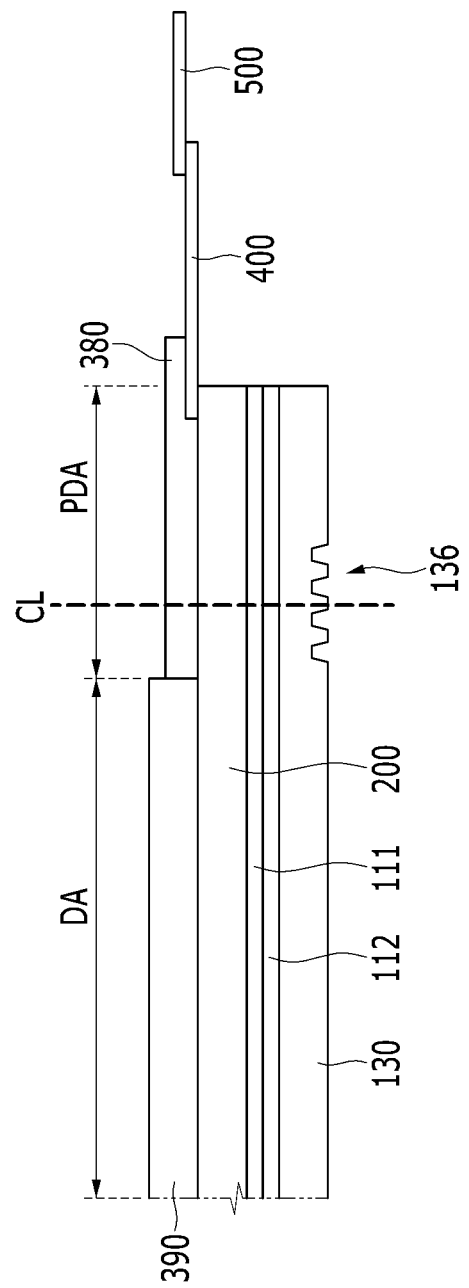
Figure 17:
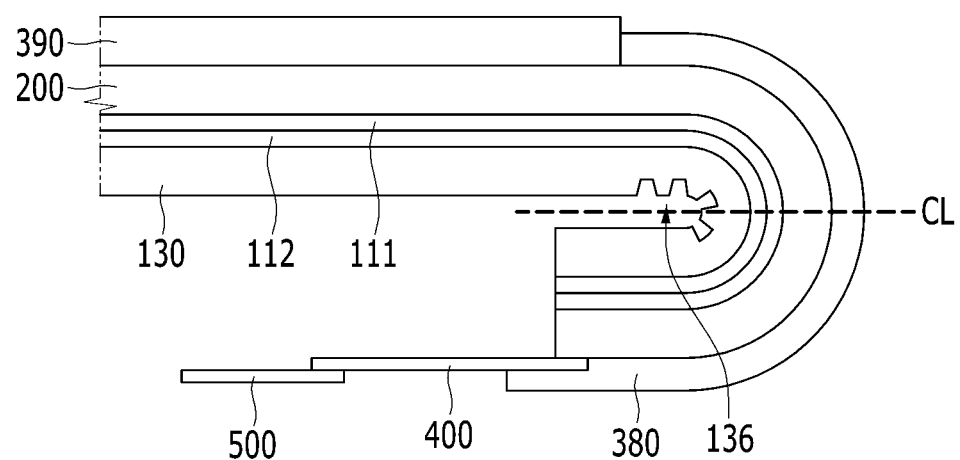
Figure 18:
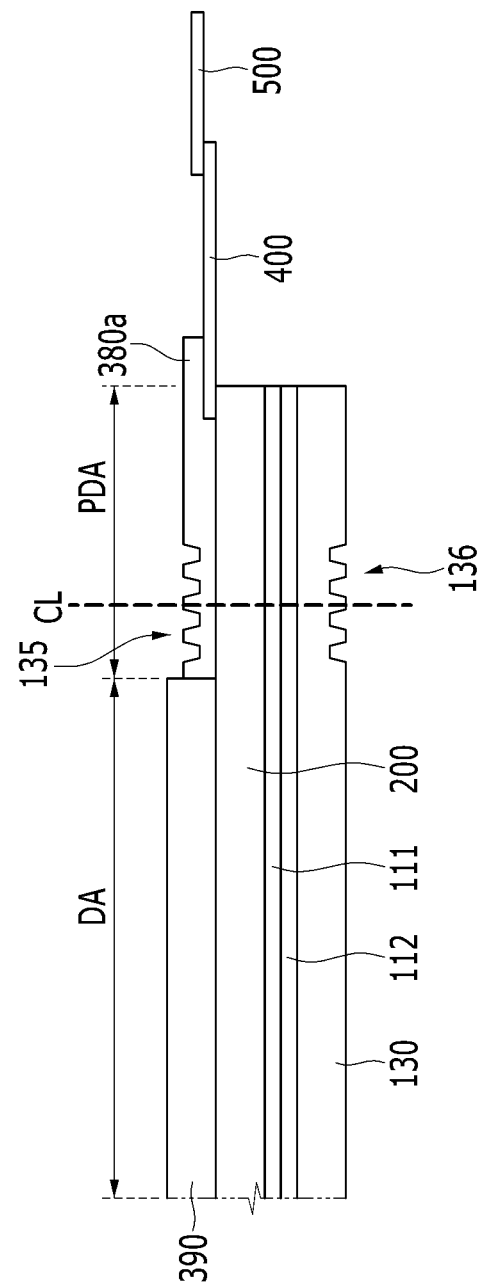
Figure 19:
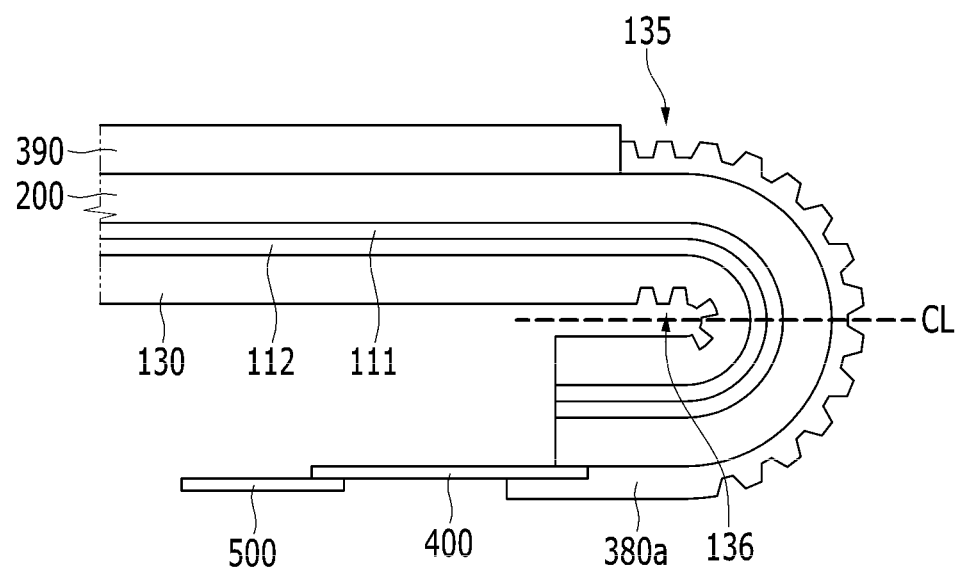

Next, FIGS. 14, 16, and 18 are cross-sectional views of the display device according to exemplary embodiments, and FIGS. 15, 17, and 19 are cross-sectional views illustrating the pad area PDA folded back in the display device of FIGS. 14, 16, and 18 respectively.

In the display device according to the embodiments illustrated in FIGS. 15, 17, and 19, the pad area PDA of the display device is curved toward an opposite side/back of the display area DA, and the circuit film 400 and the printed circuit board 500 may overlap the flexible substrate 112 at the opposite side of the display area DA/below the lower surface of the flexible substrate 112.

First, referring to FIGS. 14 and 15, the display device according to an exemplary embodiment includes a protective film 380a, which is attached to the pad area PDA and to a part of the circuit film 400 and includes the pattern portion 135, and also includes a lower protective film 130 attached to a lower portion of the flexible substrate 112.

Next, referring to FIGS. 16 and 17, the display device according to an exemplary embodiment includes a passivation layer 380, which is formed at the pad area PDA and at a part of the circuit film 400, and also includes a lower protective film 130, which is attached to the lower portion of the flexible substrate 112 and includes a pattern portion 136.

Further, referring to FIGS. 18 and 19, the display device according to an exemplary embodiment includes a protective film 380a, which is attached to the pad area PDA and to a part of the circuit film 400 and includes the pattern portion 135, and also includes a lower protective film 130, which is attached to a lower portion of the flexible substrate 112 and includes the pattern portion 136.

Because the characteristics, shape, and the like of the pattern portion 136 included in the lower protective film 130 are the same as those described above with respect to the pattern portion 135 included in the protective film 380a, detailed description of the characteristics, shape, and the like will not be repeated.

As illustrated in FIGS. 14 to 19, when the lower protective film 130 is included in the lower portion of the flexible substrate 112 while the passivation layer 380 or the protective film 380a is included in the upper portion of the flexible substrate 112, stress otherwise applied to the display device may be reduced when the display device is curved or folded.

In more detail, stress is applied to the curved portion of the display device when the display device is curved or folded, the stress including both compressive stress applied to an inner side of the curved portion, and tensile stress applied to an outer side of the curved portion. Therefore, as described above, when separate layers are included in the upper portion and the lower portion of the flexible substrate 112, both the compressive stress and the tensile stress may be reduced to reduce or prevent damage to the display device.

According to the exemplary embodiments of the present disclosure, it is possible to reduce or prevent damage to the display device that may be caused when the circuit film is released, or when cracking and the like are generated, due to the substrate being curved or folded.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims and their equivalents.

DESCRIPTION OF SOME OF THE REFERENCE CHARACTERS

| | |
|---|---|
| DA: Display area | PDA: Pad area |
| 112: Flexible substrate | 400: Circuit film |
| 500: Printed circuit board | 380: Passivation layer |
| 380a: Protective film | 130: Lower protective film |
| 135, 136: Pattern portion | |

What is claimed is:

1. A display device comprising:
   a flexible substrate having a display area for displaying an image, and a pad area adjacent the display area;
   a portion of a circuit film coupled to, and located on, the flexible substrate at the pad area; and
   a passivation layer on at least a part of the pad area inwardly before an edge of the flexible substrate, and on at least a part of the circuit film outwardly after the edge of the flexible substrate,
   wherein the portion of the circuit film is between the flexible substrate and the passivation layer at the edge of the flexible substrate at the pad area, and
   wherein the passivation layer defines a plurality of grooves at an upper surface of the passivation layer.

2. The display device of claim 1, further comprising a printed circuit board attached to the circuit film to be electrically connected with the display area.

3. The display device of claim 2, wherein the passivation layer and the printed circuit board entirely cover one side of the circuit film.

4. The display device of claim 1, further comprising a lower protective film attached to a lower portion of the flexible substrate.

5. The display device of claim 4, wherein the passivation layer is a protective film, and
   wherein the lower protective film defines a plurality of grooves at a lower surface of the lower protective film.

6. The display device of claim 4, wherein a thickness of the lower protective film is about 10 μm to about 200 μm.

7. The display device of claim 1, wherein the passivation layer is a protective film.

8. The display device of claim 7, wherein an elastic coefficient of the protective film is between about 0.1 GPa and about 200 GPa.

9. The display device of claim 7, wherein a thickness of the protective film is about 10 µm to about 200 µm.

10. The display device of claim 7, wherein the protective film comprises at least one of polyethylene terephthalate, polyethylene naphthalate, polycarbonate, polyarylate, polyetherimide, polyethersulfone, or polyimide.

11. The display device of claim 1, wherein the passivation layer comprises at least one of an acryl-based polymer, a urethane-based polymer, or an epoxy-based polymer.

12. The display device of claim 11, wherein a viscosity of the passivation layer is about 100 cp to about 3,000 cp.

13. The display device of claim 1, wherein the pad area is curved toward a lower surface of the flexible substrate, and
    wherein the circuit film overlaps the flexible substrate at a point below the lower surface of the flexible substrate.

14. The display device of claim 1, wherein the passivation layer is a protective coating layer.

15. A display device comprising:
    a flexible substrate having a display area for displaying an image, and a pad area adjacent the display area;
    a portion of a circuit film coupled to, and located on, the flexible substrate at the pad area and extending in a first direction from the pad area to beyond an edge of the pad area; and
    a passivation layer on the pad area and extending in the first direction from the pad area to beyond the edge of the pad area, and from over the flexible substrate to beyond an edge of the flexible substrate, to overlap with at least a part of the circuit film at a position that is away in the first direction from the edge of the pad area,
    wherein the portion of the circuit film is between the flexible substrate and the passivation layer at the edge of the flexible substrate at the pad area and
    wherein the passivation layer defines a plurality of grooves at an upper surface of the passivation layer.

* * * * *